Figure 1:
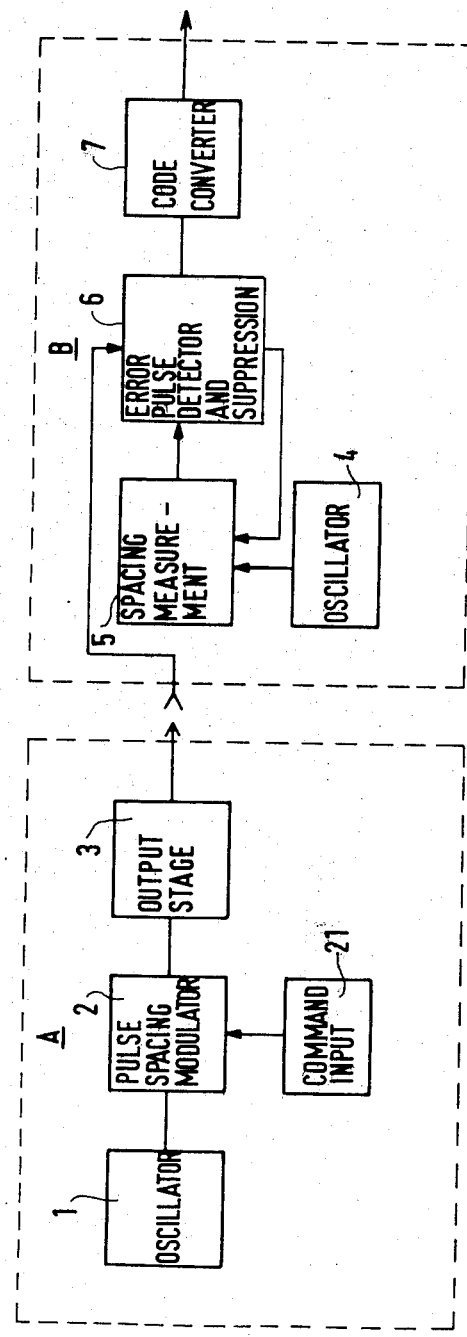

United States Patent [19]

Gerlach et al.

[11] 4,232,297
[45] Nov. 4, 1980

[54] REMOTE CONTROL ARRANGEMENT USING PULSE SPACING MODULATOR

[75] Inventors: Albrecht Gerlach, Emmendingen; Dieter Holzmann; Guenter Lindstedt, both of Freiburg; Rolf-Dieter Burth, Oberried, all of Fed. Rep. of Germany

[73] Assignee: ITT Industries, Inc., New York, N.Y.

[21] Appl. No.: 970,059

[22] Filed: Dec. 15, 1978

[30] Foreign Application Priority Data

Jan. 24, 1978 [DE] Fed. Rep. of Germany ....... 2802867

[51] Int. Cl.³ .............................................. H04Q 9/10
[52] U.S. Cl. ................................ 340/168 S; 340/148; 340/171 R; 328/74
[58] Field of Search ............ 340/168 R, 168 B, 168 S, 340/171 R, 148, 167 A, 167 R; 332/11 R; 178/53.1, 66; 325/38; 328/74

[56] References Cited

U.S. PATENT DOCUMENTS

| | | | |
|---|---|---|---|
| 3,686,634 | 8/1972 | Malchman et al. | 340/171 A |
| 3,855,575 | 12/1974 | Leuschner et al. | 340/171 R |
| 3,890,581 | 6/1975 | Stuart et al. | 332/11 R |
| 3,990,047 | 11/1976 | Sachs et al. | 340/167 R |
| 4,020,477 | 4/1977 | Holland | 340/167 R |
| 4,099,163 | 7/1978 | Worley et al. | 340/168 B |
| 4,121,198 | 10/1978 | Tsuboi et al. | 340/171 R |

Primary Examiner—Donald J. Yusko
Attorney, Agent, or Firm—John T. O'Halloran; Peter C. Van Der Sluys

[57] ABSTRACT

A remote control arrangement uses pulse code modulation for transmission as in infrared remote control arrangements. A feature of the arrangement is that only one quartz oscillator is necessary and is used in the receiver part. The receiver measures the first pulse width transmitted and, dependent on that, defines the measured period of a control circuit. A primary feature is that the arrangement is provided with a prepulse having a threefold pulse width before the start pulse thereby allowing the preamplifier of the receiver to be in its normal operating area when the start pulse occurs.

4 Claims, 5 Drawing Figures threefold pulse spacing T is contained in the control command. In the code converter 7, which will be described below, this information serves to derive the two amplitude values of the binary information.

As a result of the logic operations performed by the second multiple gate 67, the following errors in the control command, which may have developed on the transmission path, for example, are detected and suppressed:

(a) if no additional input pulse occurs after two zero transitions of the up-down preset counter 50;

(b) if, at the end of the control command, an input pulse occurs during the threefold time interval 3T after the single or twofold time interval, or (c) if, at the end of the control command, no input pulse occurs during the threefold time interval 3T at the end thereof.

Since, with these logic operations, both the individual pulse spacings 2T and, in the cases b) and c), the desired number of pulses of each control command are monitored, all possible errors are detected except a double error formed by one additional pulse and one missing pulse which would have to lie between two L-bits. The occurrence of such an error results in the up-counter 63 and, hence, the other subcircuits being reset. To this end, the zero count output 6320 of the up-counter 63 is also coupled to the reset input 610 of the memory 61.

Figure 3:
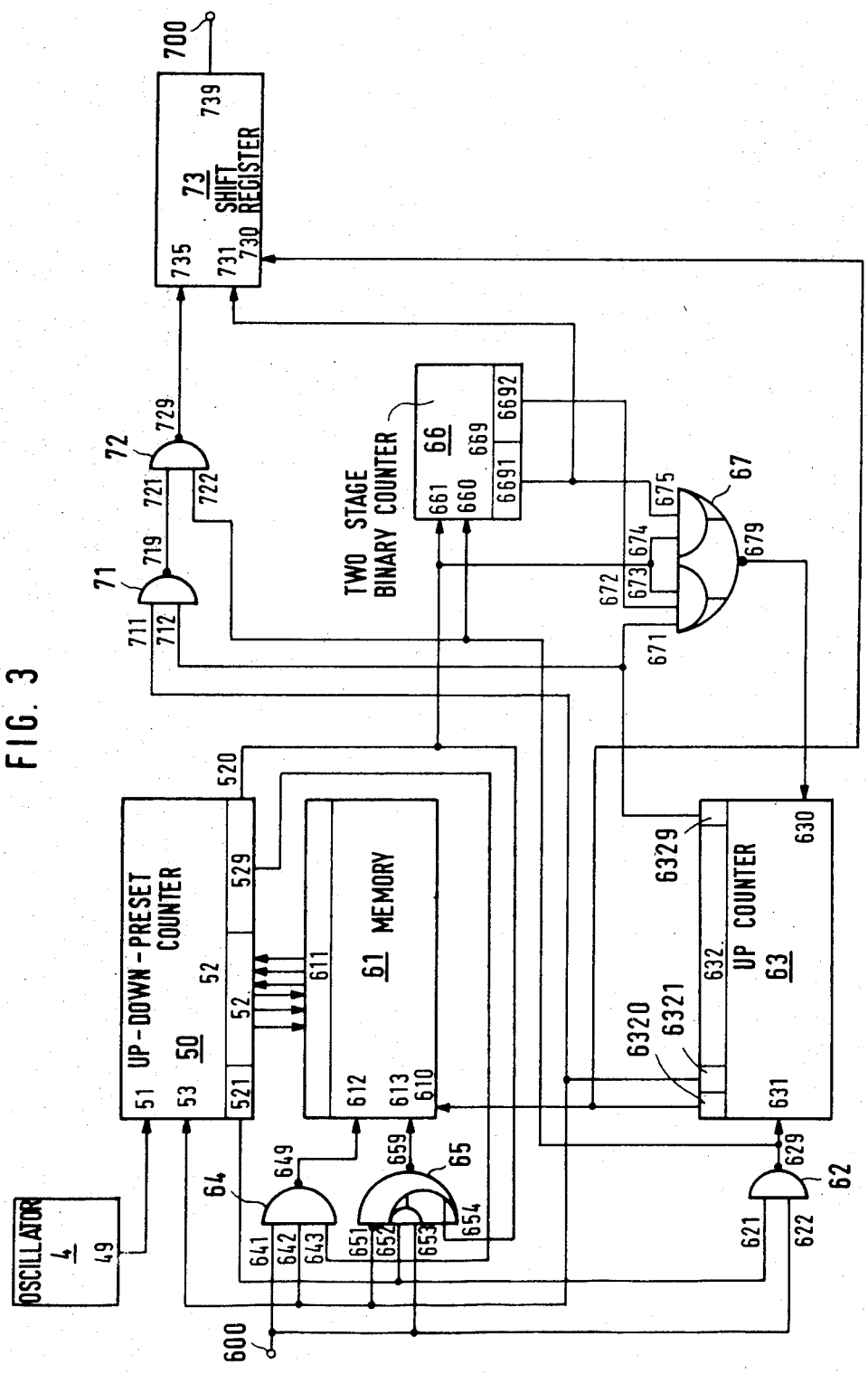

In the embodiment of FIG. 3, the code converter 7 contains the third NAND gate 71, the fourth NAND gate 72, and the shift register 73. The first input 711 of the third NAND gate 71 is connected to the output 6321 for the count "one" of the up-counter 63, while the second input 712 is connected to that output, 6329, of this up-counter which corresponds to the number of bits contained in the control command. The first input 721 of the fourth NAND gate 72 is connected to the output 719 of the third NAND gate 71, and the second input 722 to the output 629 of the first NAND gate 62, while the output 729 of this fourth NAND gate 72 is coupled to the shift-pulse input 735 of the shift register 73.

The information input 731 of the shift register 73 is connected to the output 6691 of the first stage of the two-stage binary counter 66, and the reset input 730 to the zero count output 6320 of the up-counter 63. The output 739 of the shift register 73 is coupled to the signal output 700, from which the binary code contained in the control command as the pulse spacing can be taken as the binary code of two different amplitude values. Thus, the shift register 73 is fed with the binary values corresponding to the two pulse spacings T, 2T differing from each other by a factor of 2, which binary values are shifted one place in the shift register on the occurrence of each regular input pulse.

The embodiment of FIG. 3 uses "positive logic", i.e., the binary zero is represented by a low amplitude value, and the binary one by a high amplitude value. It is, of course, possible to use "negative logic", where the binary zero is represented by a high amplitude value, and the binary one by a low amplitude value. In that case, the individual subcircuits must be correspondingly converted according to known rules. This applies in particular to the various gates contained in the embodiment of FIG. 3.

This invention is predicated, inter alia, on the discovery that for the duration of a control command, which is a maximum of about 2.5 ms (pulse spacing T about 100 $\mu$s) in the embodiment described, the relative frequency change $\Delta f/f$ of the first oscillator is constant so that for each control command the first time interval T occurring at the beginning can, after its measurement, be taken as the time base for further evaluation, as is described above in detail.

One advantage of the invention is seen in the fact that both interference pulses contained in the received signal and falling within the lower count range of the up-down preset counter 50, and transmitted pulses not received by the receiver are detected and result in this control command being not evaluated. The remote control arrangement of the above illustrated embodiment cannot handle all possible cases of disturbances in an optimum manner.

The variable-gain preamplifier 8 (cf. FIG. 4) provided at the receiving end is operated at high gain during transmission intervals, and this gain is not decreased, with the usual delay until the start pulse x is received. Reflections of the start pulse or any other disturbance which occur during this delay, will therefore be amplified and may be evaluated by the measuring circuit 5.

According to a primary feature of the invention, the start pulse x is preceded by the prepulse z at a distance 3T (cf. FIG. 5), which has already decreased the gain of the preamplifier 8 when the start pulse x occurs.

With the error-pulse detection and suppression circuit 6 and the measuring circuit 5 operating as described above, the prepulse z does not interfere with the above-explained binary information processing sequence.

Figure 4:
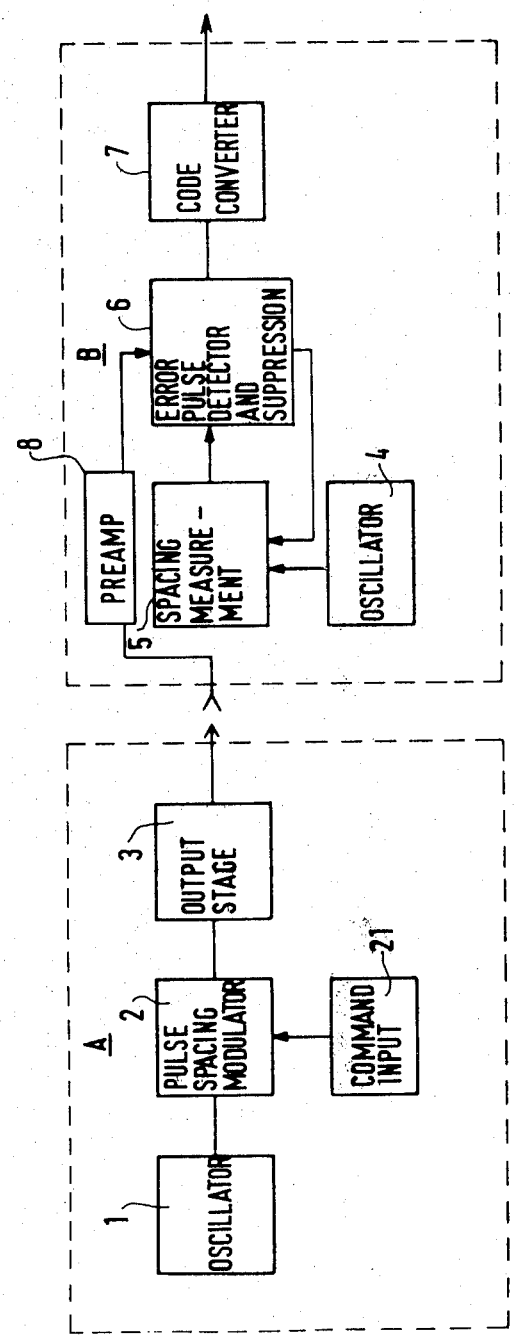

The receiver B' of this invention can therefore be equal in design to the receiver B of the main application. In the embodiment of FIG. 4, the preamplifier is shown within the receiver B' for simplicity. It may, of course, also be disposed outside the receiver B'.

Since the prepulse z is located three distances T in front of the start pulse x, the subcircuits 5, 6 have already returned to their original states when the prepulse arrives, so that the above-described measuring and working phase can go off undisturbed by this prepulse.

Figure 2:
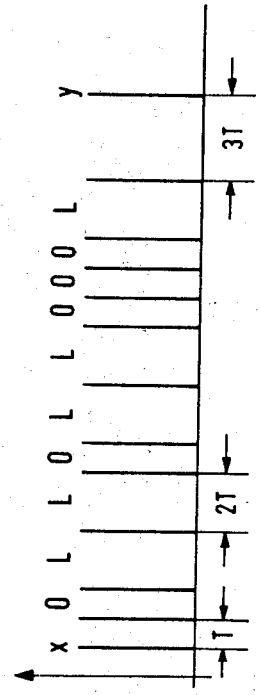
Figure 5:
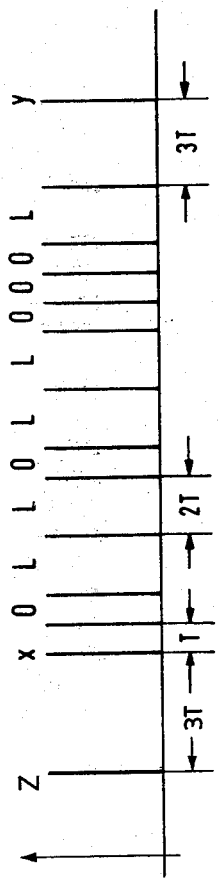

The pulse pattern illustrated in FIG. 5 differs from the pulse pattern illustrated in FIG. 2 only in that the prepulse z has been added according to a primary feature of this invention.

While we have described above the principles of our invention in connection with specific apparatus it is to be clearly understood that this description is made only by way of example and not as a limitation to the scope of our invention as set forth in the objects thereof and in the accompanying claims.

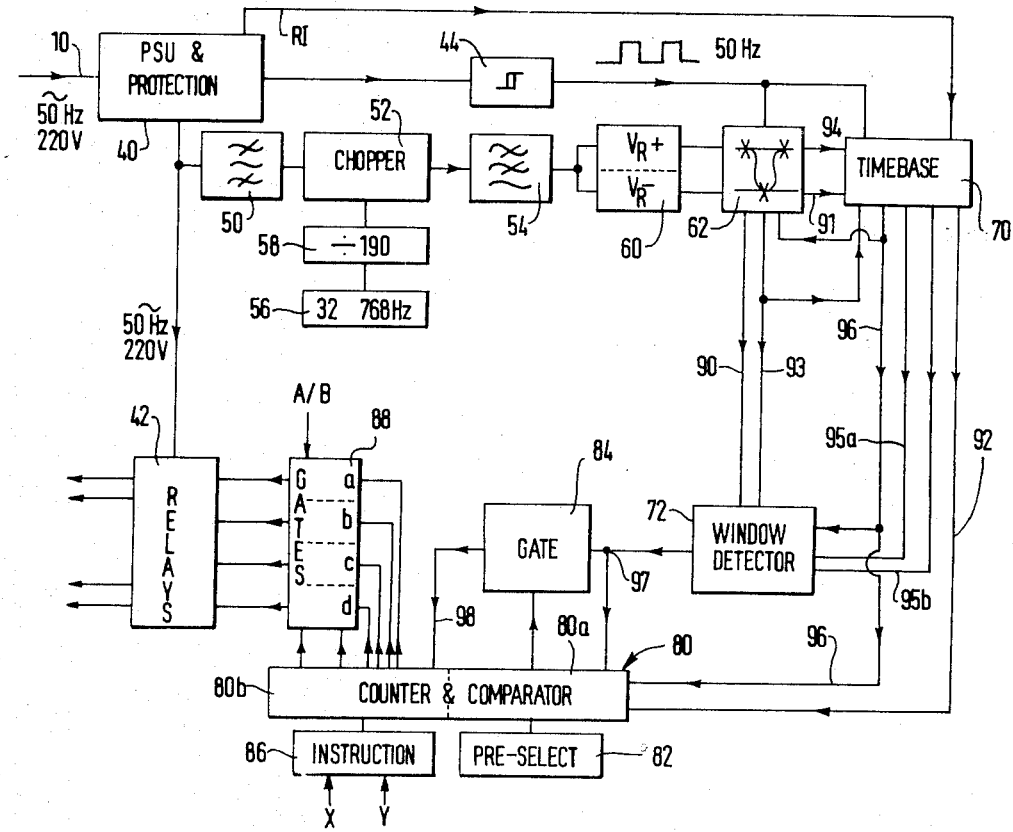

What is claimed is:

1. In a remote control system of the type including a transmitter capable of transmitting a digital control command signal comprising a predetermined number of pulses, each indicative of a binary one or a binary zero, with a binary one manifesting a separation from a successive pulse of a fixed period 2T, with a binary zero manifesting a separation from a successive pulse of a fixed period T, said control signal always of a given pattern as starting with a first prepulse Z, followed by a second start pulse X separated from said first prepulse Z by a fixed period 3T, with a first command pulse C always following said X pulse by the period T with a fixed number of information pulses indicative of binary ones and zeroes, as determined by said fixed period separation, following said first command pulse, with a terminating end pulse Y spaced from said last information pulse by the period 3T, whereby a complete control command signal is always of the form Z,X,C, $X_1, X_2 \ldots X_{N1} Y$, where:

$X_1$ = first binary bit (zero or one)
$X_2$ = second binary bit (zero or one)
$X_N$ = last binary bit (zero or one)

wherein:

if $X_1$ is a zero, it is separated from $X_2$ by T, and if $X_1$ is a one, it is separated from $X_2$ by 2T, the combination therewith of receiving apparatus for detecting said command signal as transmitted, comprising:

preamplifier means responsive to the reception of said command signal and responsive to said Z pulse for reducing the gain of said preamplifier upon receipt of any pulse indicative of a Z pulse, whereby a reduction of gain is indicative of an anticipated following transmission of the remainder of said command signal, said preamplifier providing at an output, an amplified version of said command signal, an oscillator circuit for providing a continuous train of pulses, each separated by a substantially smaller period than said fixed period T, with said pulse train at a given random frequency with respect to said command signal, an up-down counting means responsive to said continuous train of pulses for counting said pulses in an up direction in a first mode and a down direction in a second mode, first logic means coupled to said counter and responsive to said start pulse X for causing said up counter to commence counting said train of pulses in said first mode, memory means coupled to said up-down counter and operative to store said count upon receipt of a control signal, second logic means coupled to said memory means and responsive to said first command pulse C to provide said control signal to cause said memory to store said count indicative of a given number of pulses emanating from said oscillator during the period T as separating said X pulse from said first command pulse C, said logic means including means for coupling said control signal to said up-down counter to cause said counter to commence counting in said second mode, zero detecting means coupled to said up-down counter and operative to decode an all zero state indicative of said counter counting down said period T, said detecting means including means for transferring said count as stored in said memory to said up-down counter to again cause said counter to count down from said stored count, binary counting means coupled to said zero detecting means and responsive to said input signal to provide an output indicative of the number of all zero states manifested by said up-down counter between successive pulses of said command signal, whereby a count of one manifests the receipt of a binary zero indicative of a T pulse separation, a count of two manifests the receipt of a binary one indicative of a 2T pulse separation and a count of three manifests receipt of a terminating pulse indicative of a 3T separation, register means coupled to said binary counting means and responsive to said input signal for storing values indicative of binary ones and zeroes as determined by said T or 2T separation, with said data as stored indicative of said information bits of said digital command signal.

2. The remote control system according to claim 1 wherein
said second logic means includes an up counter operative to count the pulses in said command input signal.

3. The remote control system according to claim 1 wherein
said fixed period T is approximately equal to one hundred microseconds.

4. The remote control system according to claim 1 wherein
said number of command information bits $C, X_1 \ldots X_{N1}$ is ten.

* * * * *

United States Patent [19]

Ley

[11] 4,232,298

[45] Nov. 4, 1980

[54] REMOTELY-CONTROLLABLE RELAYS AND FILTERS THEREFOR

[75] Inventor: Anthony J. Ley, Bievres, France

[73] Assignee: ENERTEC, Montrouge, France

[21] Appl. No.: 905,394

[22] Filed: May 12, 1978

[30] Foreign Application Priority Data

May 16, 1977 [GB] United Kingdom ............... 20563/77
Sep. 23, 1977 [GB] United Kingdom ............... 39652/77

[51] Int. Cl.² ...................... G01R 23/02; H03K 9/06; H04Q 9/10
[52] U.S. Cl. ........................... 340/171 R; 324/79 R; 328/134; 340/310 R
[58] Field of Search ...................... 324/79 R; 328/134; 340/171 R, 310 R

[56] References Cited

U.S. PATENT DOCUMENTS

| | | | |
|---|---|---|---|
| 3,636,446 | 1/1972 | Genter et al. | 324/79 R |
| 3,659,212 | 4/1972 | Saliga | 328/167 O |
| 3,681,689 | 8/1972 | Correard et al. | 324/79 R |
| 3,693,081 | 9/1972 | Aviander | 324/79 R |
| 3,852,722 | 12/1974 | Neuville | 340/167 X |
| 3,876,951 | 4/1975 | McLean et al. | 328/134 |
| 4,017,801 | 4/1977 | Riedel | 324/79 R |
| 4,021,653 | 5/1977 | Sharp et al. | 328/134 |
| 4,127,824 | 11/1978 | Bennett, Jr. | 328/134 |

FOREIGN PATENT DOCUMENTS

| | | |
|---|---|---|
| 1257430 | 2/1961 | France . |
| 586182 | 3/1947 | United Kingdom . |
| 1114792 | 5/1968 | United Kingdom . |
| 1114983 | 5/1968 | United Kingdom . |
| 1142426 | 2/1969 | United Kingdom . |
| 1150122 | 4/1969 | United Kingdom . |
| 1452803 | 2/1976 | United Kingdom . |
| 1434037 | 4/1976 | United Kingdom . |
| 1452433 | 10/1976 | United Kingdom . |

OTHER PUBLICATIONS

Kidd, "Development, Design and Use of Ripple Control," Proc. IEE, vol. 122, No. 10R, Oct. 1975, IEE Reviews.

Primary Examiner—Donald J. Yusko

[57] ABSTRACT

A remotely-controllable relay which is controlled by 175 Hz ripple voltage superimposed on the mains supply voltage in an electric-power distribution network contains an oscillator generating a signal at 173 Hz. This is mixed with the network voltage so that, when ripple voltage is present, a beat note at a frequency of 2 to 3 Hz is generated. This beat note is separated from the unwanted signals, such as the mains supply voltage, by a third order active low-pass filter to control operation of the relay. A similar technique provides simplified detection of output signals from correlation-type filters.

21 Claims, 14 Drawing Figures